United States Patent
Harada et al.

(10) Patent No.: US 10,067,161 B2
(45) Date of Patent: Sep. 4, 2018

(54) SOCKET

(71) Applicant: YOKOWO CO., LTD., Kita-ku (JP)

(72) Inventors: Yuji Harada, Tomioka (JP); Daisuke Hosokawa, Tomioka (JP)

(73) Assignee: Yokowo Co., Ltd., Tokyo (JP)

( * ) Notice: Subject to any disclaimer, the term of this patent is extended or adjusted under 35 U.S.C. 154(b) by 101 days.

(21) Appl. No.: 15/133,371

(22) Filed: Apr. 20, 2016

(65) Prior Publication Data

US 2016/0313371 A1    Oct. 27, 2016

(30) Foreign Application Priority Data

Apr. 23, 2015 (JP) ................... 2015-088806

(51) Int. Cl.
*G01R 1/04* (2006.01)
*G01R 31/28* (2006.01)
*G01R 1/073* (2006.01)

(52) U.S. Cl.
CPC ................. *G01R 1/0466* (2013.01)

(58) Field of Classification Search
CPC .. G01R 1/0483; G01R 1/0466; G01R 1/0433; G01R 31/2893; G01R 31/2886
See application file for complete search history.

(56) References Cited

U.S. PATENT DOCUMENTS

| | | | | |
|---|---|---|---|---|
| 4,679,318 A * | 7/1987 | Bright | ................ | H05K 3/3421 29/747 |
| 5,885,101 A | 3/1999 | Matsuoka et al. | | |
| 6,992,496 B2 * | 1/2006 | Winter | ................ | G01R 1/0441 324/750.25 |
| 8,535,101 B2 | 9/2013 | Suzuki et al. | | |
| 2004/0212381 A1 * | 10/2004 | Yoshida | ............. | G01R 1/06772 324/755.02 |
| 2004/0212383 A1 | 10/2004 | Yanagisawa et al. | | |
| 2006/0094134 A1 * | 5/2006 | Yoshida | ................ | G01R 1/045 438/14 |
| 2008/0088331 A1 * | 4/2008 | Yoshida | ............... | G01R 1/0466 324/755.05 |
| 2009/0230983 A1 * | 9/2009 | Yoshida | ............... | G01R 1/0466 324/756.02 |

FOREIGN PATENT DOCUMENTS

| | | |
|---|---|---|
| JP | 9-55449 A | 2/1997 |
| JP | 11-109875 A | 4/1999 |
| JP | 2002-367748 A | 12/2002 |
| JP | 2004-325305 A | 11/2004 |
| JP | 2004-325306 A | 11/2004 |
| JP | 2008-70146 A | 3/2008 |
| JP | 2012-98219 A | 5/2012 |

OTHER PUBLICATIONS

Japanese Office Action dated Jun. 13, 2018 in corresponding Japanese Patent Application No. 2015-088806 along with machine English translation of same.

* cited by examiner

*Primary Examiner* — Jermele M Hollington
*Assistant Examiner* — Suresh K Rajaputra
(74) *Attorney, Agent, or Firm* — Morgan, Lewis & Bockius LLP (57) ABSTRACT

A socket includes: a plurality of contact probes; a pin block which is configured to support the plurality of contact probes; and a retainer which is configured to support the plurality of contact probes. The pin block and the retainer are stacked and fixed to each other. The retainer is engaged with the pin block by concavo-convex engagement.

10 Claims, 8 Drawing Sheets

SOCKET

CROSS-REFERENCE TO RELATED APPLICATION(S)

This application is based upon and claims the benefit of priority from prior Japanese patent application No. 2015-088806, filed on Apr. 23, 2015, the entire contents of which are incorporated herein by reference.

BACKGROUND

The present invention relates to a socket provided with a plurality of contact probes, which is used, for example, for inspecting a device to be measured such as a semiconductor integrated circuit.

In case of inspecting an object to be inspected such as a semiconductor integrated circuit, a socket provided with a plurality of contact probes is used, for the purpose of electrically connecting the object to be inspected with an inspecting board at a side of a measuring device. The socket of this type supports the respective contact probes by means of a pin block having through holes, and a retainer. Each of the contact probes includes two plungers which are urged by a spring so as to be separated from each other (refer to, for example, JP-A-2004-325305 and JP-A-2004-325306).

When the socket is mounted on the inspecting board as a preparatory step before the inspection, one of the plungers is retracted by the inspecting board, and the spring is compressed. The retainer which serves as a detention unit for the contact probe receives a restoring force of the spring. In case of the socket having a number of the contact probes, a force to be exerted on the retainer due to the restoring force of the spring (preload) is increased, and hence, the retainer tends to be warped. In case where the retainer can be fixed with screws to the pin block, for example, in a center part of a region where the contact probes are arranged, it is possible to depress a warp of the retainer due to a preload. However, actually, it is difficult to provide a space for screw fastening in the region where the contact probes are arranged.

SUMMARY

The present invention may provide a socket in which a warp of a retainer due to a preload can be depressed.

An aspect of the present invention is a socket. The socket may comprise: a plurality of contact probes; and a pin block and a retainer which are stacked and fixed to each other, and which are configured to support the plurality of contact probes, wherein the retainer is engaged with the pin block by concavo-convex engagement.

The concavo-convex engagement of the retainer with the pin block may be fixation by press-fitting.

The retainer may have a stepped part or a taper part in a concavo-convex engaged part where the retainer is engaged with the pin block, and the stepped part or the taper part may be collapsed in a direction different from an engaging direction.

The retainer may be formed of resin, and the pin block may be formed of metal.

The pin block may have a concave part for the concavo-convex engagement with the retainer, and the concave part may be provided in a region where a through hole for supporting a contact probe for a high frequency signal is not formed.

The retainer and the pin block may be engaged with each other by the concavo-convex engagement, by means of an annular concave part which is provided in one of the retainer and the pin block, and an annular convex part which is provided in the other of the retainer and the pin block.

Each of the plurality of contact probes may have two plungers which are urged so as to be separated from each other by a spring.

One of the plungers of each of the plurality of contact probes at a side of an object to be inspected may be protruded from a surface of the retainer.

The socket may comprise: a plurality of contact probes; a retainer which is configured to support the plurality of contact probes, and which is provided with one of a concave part and a convex part which are engaged with each other; and a pin block which is provided with the other of the concave part and the convex part.

The retainer may have a plurality of through holes through which the plurality of contact probes passes respectively, and at least two of the plurality of through holes may be provided in the one of the concave part and the convex part of the retainer.

It is to be noted that desired combinations of the above described constituent elements, and descriptions of the present invention which are converted between methods and systems are also deemed effective as features of the invention.

DETAILED DESCRIPTION OF EXEMPLARY EMBODIMENTS

Now, preferred embodiments of the invention will be described in detail, referring to the drawings. It is to be noted that the same or equivalent constituent elements and members which are shown in the respective drawings will be denoted with the same reference numerals, and overlapped descriptions will be appropriately omitted. Moreover, the invention is not limited to the embodiments, but the embodiments simply exemplify the invention. All the features which are described in the embodiments and combinations of the features are not absolutely essential to the invention.

Figure 1:
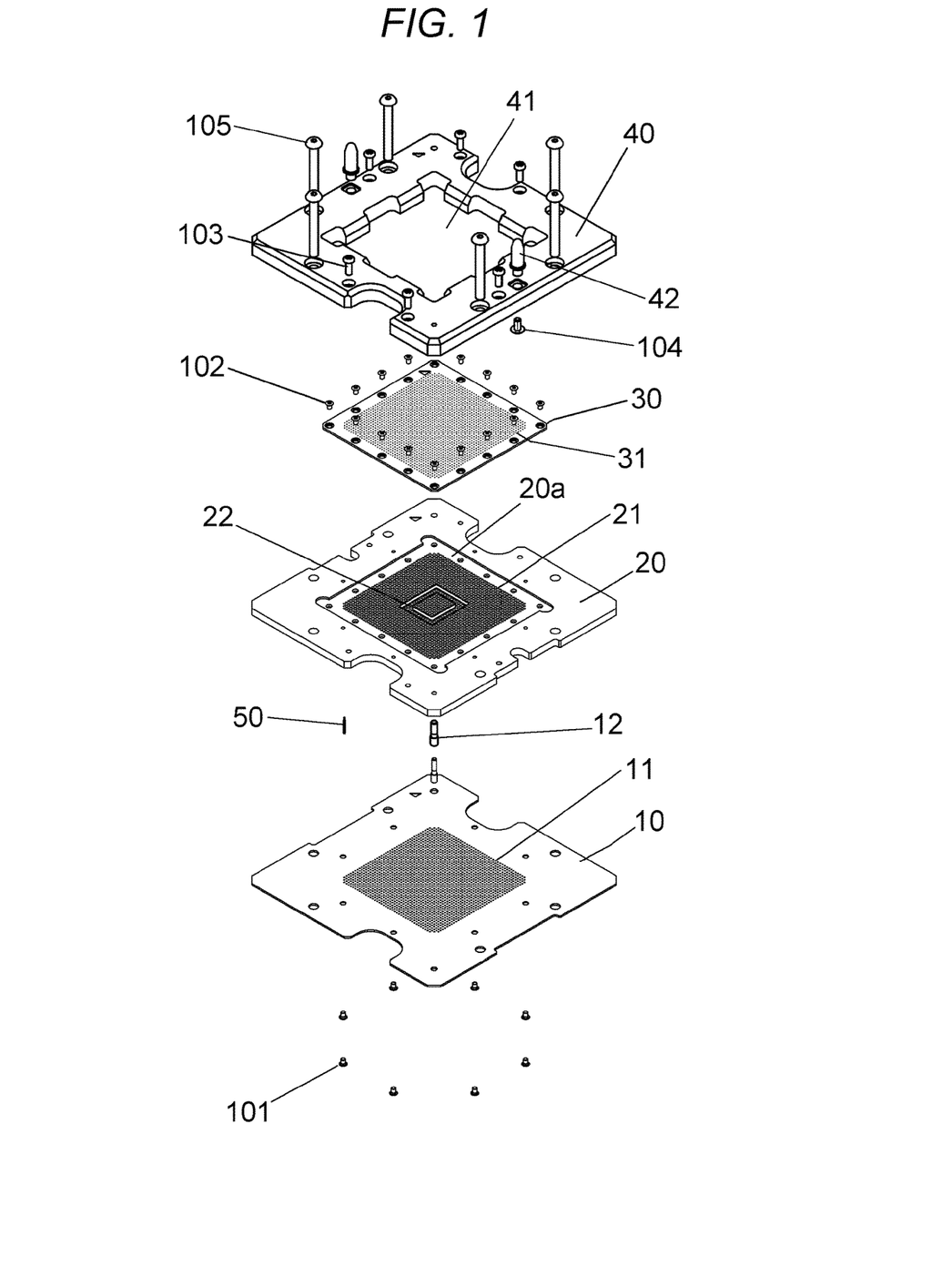
FIG. 1 is an exploded perspective view of a socket 1 according to an embodiment of the invention.

FIG. 1 is an exploded perspective view of a socket 1 according to the embodiment of the invention. It is to be noted that only one of numerous contact probes 50 is shown in FIG. 1, and the other contact probes 50 are omitted. FIG.

Figure 2:
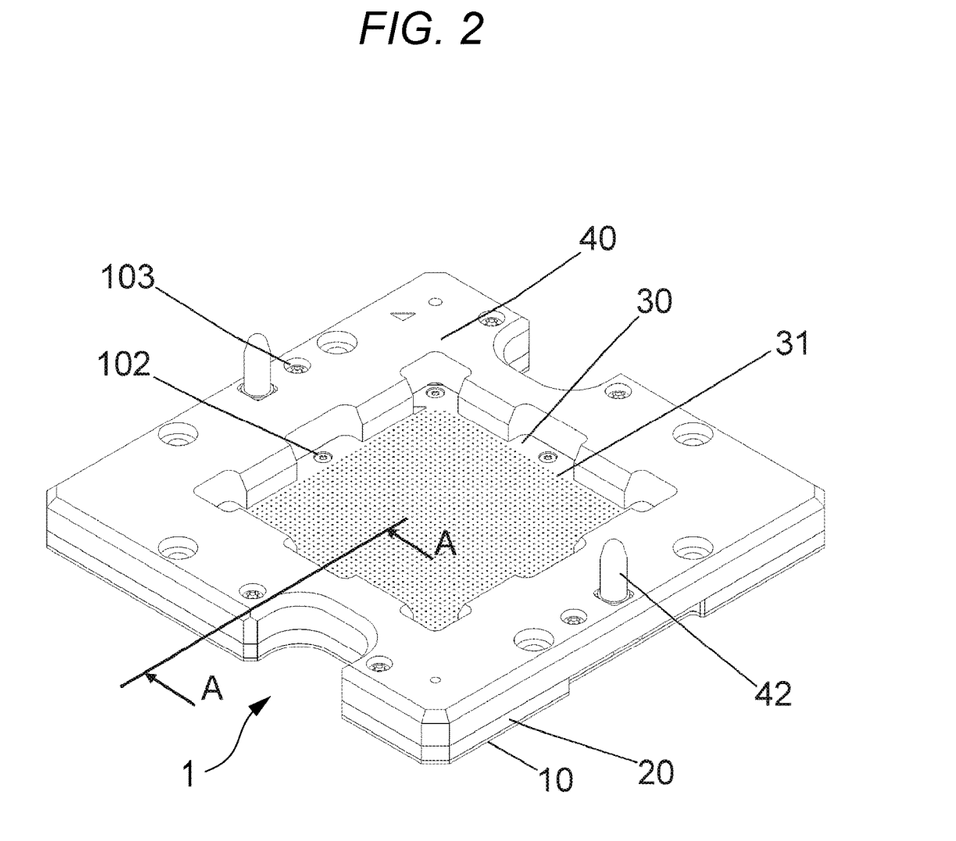
FIG. 2 is a perspective view of the socket 1.
Figure 3:
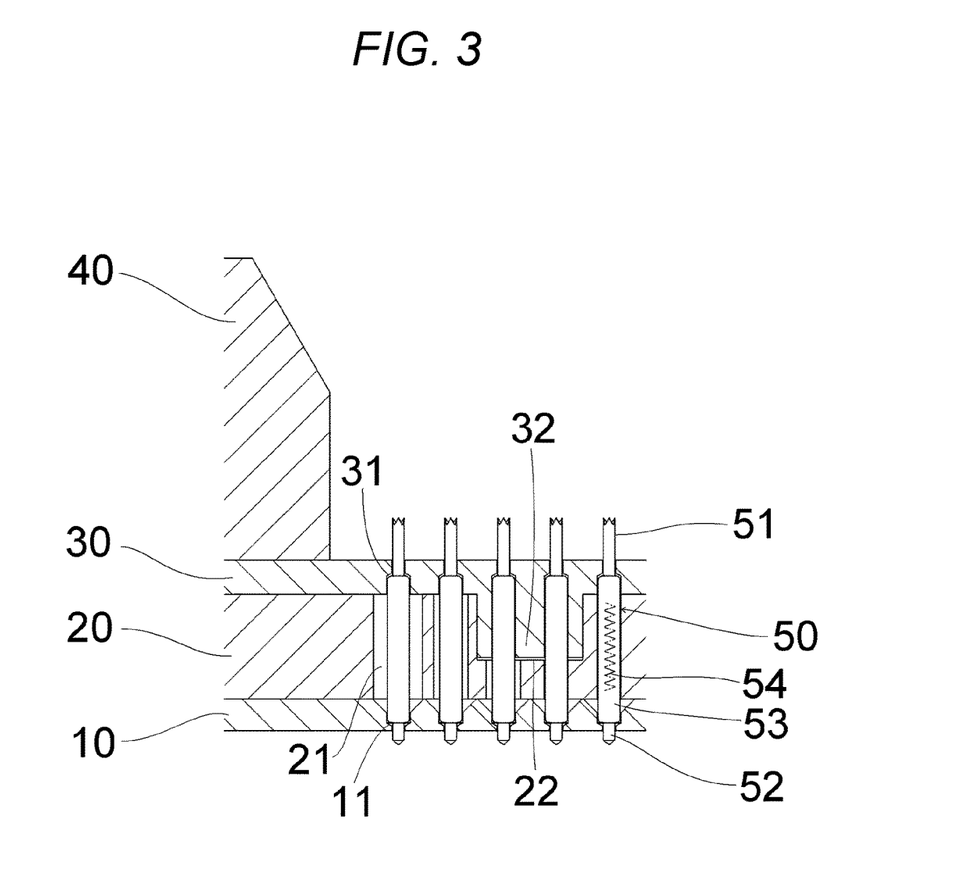
FIG. 3 is an enlarged sectional view taken along a line A-A in FIG. 2.
Figure 4:
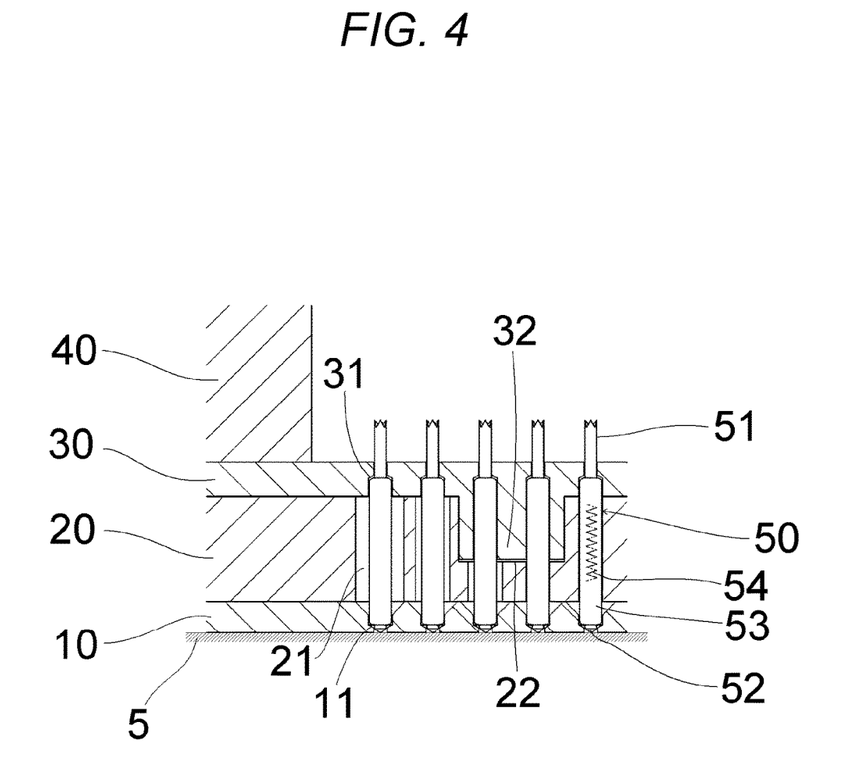
FIG. 4 is a sectional view of the socket 1 which is set on an inspecting board 5 at a side of a tester, taken along the same sectional plane as in FIG. 3.
Figure 5A:
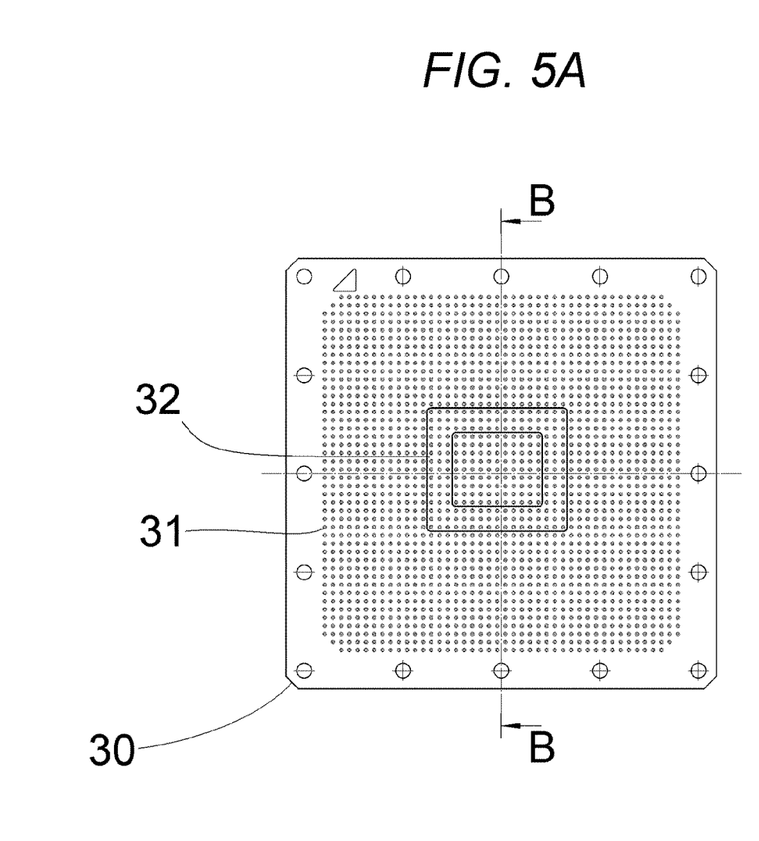
FIG. 5A is a bottom view of a retainer 30 in FIG. 1, as seen from a side of a pin block 20.
Figure 5B:
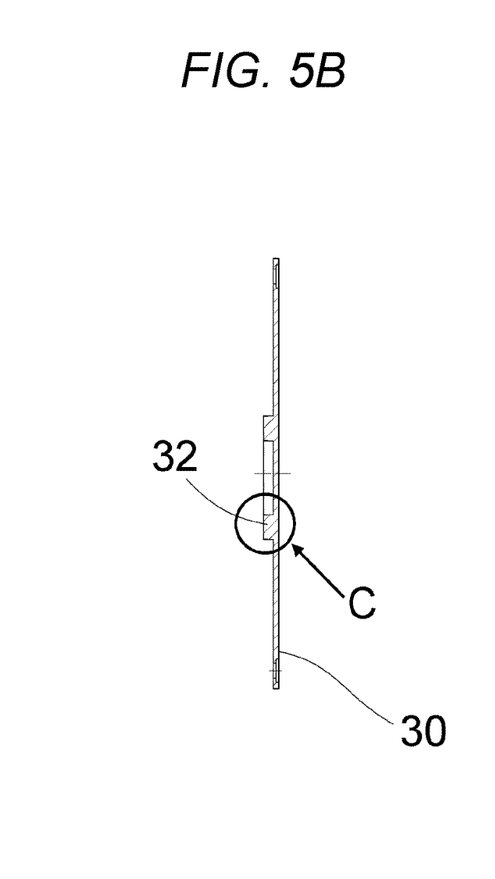
FIG. 5B is a sectional view taken along a line B-B in FIG. 5A.
Figure 6:
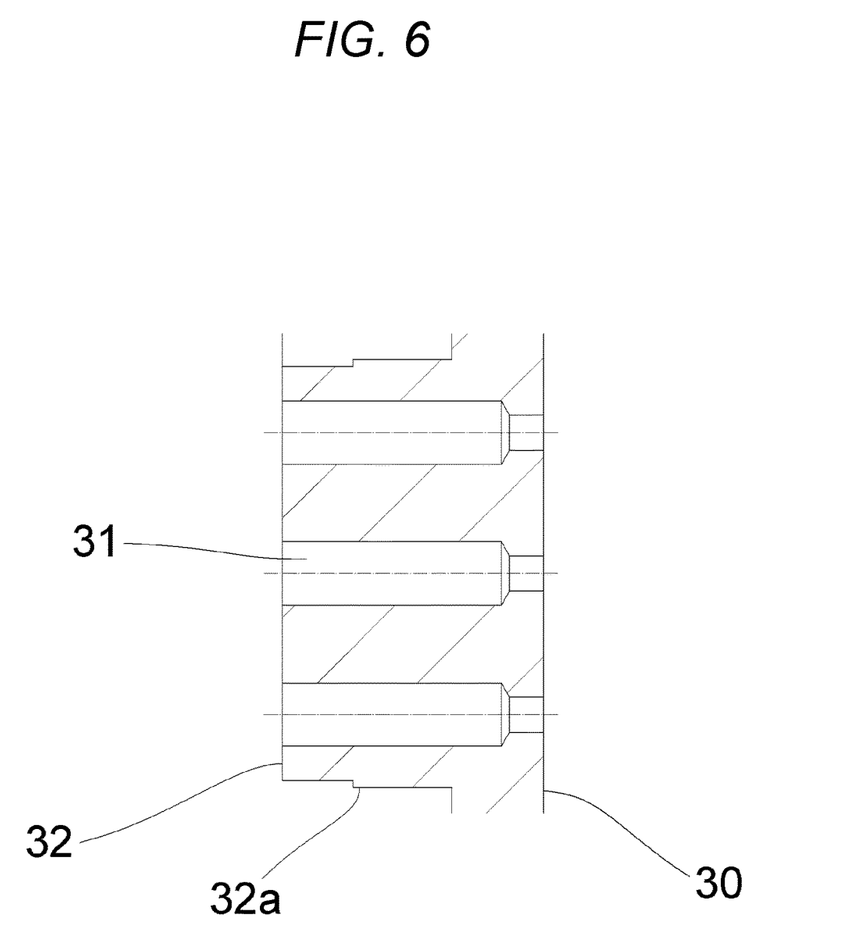
FIG. 6 is an enlarged sectional view of an encircled part C in FIG. 5B.
Figure 7A:
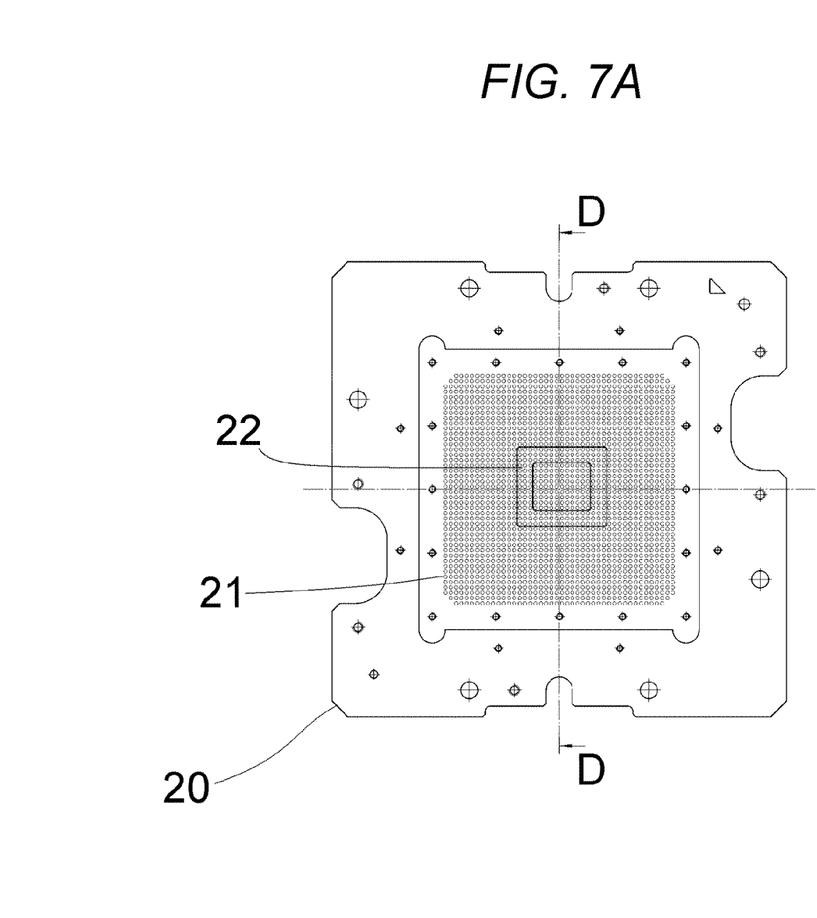
FIG. 7A is a plan view of the pin block 20, as seen from a side of the retainer 30.
Figure 7B:
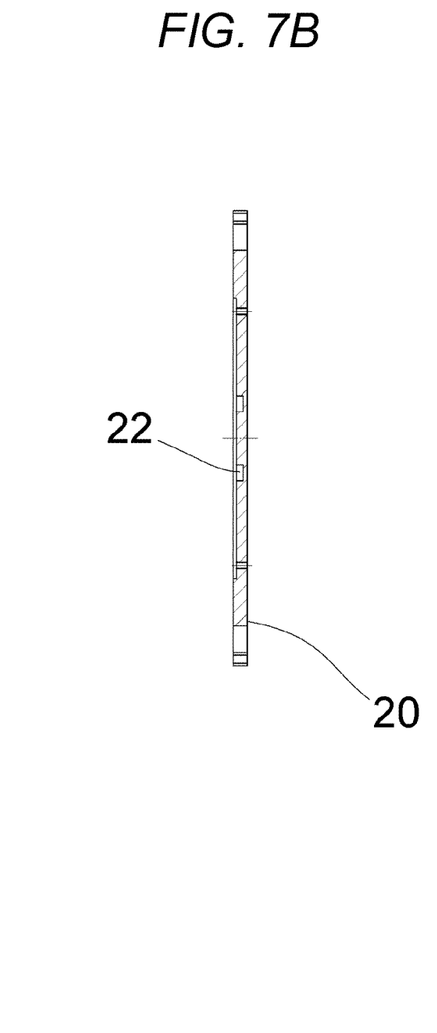
FIG. 7B is a sectional view taken along a line D-D in FIG. 7A.

2 is a perspective view of the socket 1. FIG. 3 is an enlarged sectional view taken along a line A-A in FIG. 2. FIG. 4 is a sectional view of the socket 1 which is set on an inspecting board 5 at a side of a tester, taken along the same sectional plane as in FIG. 3. FIG. 5A is a bottom view of a retainer 30 in FIG. 1, as seen from a side of a pin block 20. FIG. 5B is a sectional view taken along a line B-B in FIG. 5A. FIG. 6 is an enlarged sectional view of an encircled part C in FIG. 5B. FIG. 7A is a plan view of the pin block 20, as seen from a side of the retainer 30. FIG. 7B is a sectional view taken along a line D-D in FIG. 7A.

The socket 1 is, for example, a socket which is used for inspecting a device to be measured such as a semiconductor integrated circuit, and provided with a plurality of (numerous) contact probes 50. The socket 1 includes an insulating pin plate 10, a pin block 20 formed of metal, and an insulating retainer 30 which are stacked, in order, from a side of a tester (a side of an inspecting device). An integrated body stacked in this manner has a plurality of (numerous) through holes for supporting the respective contact probes 50.

The pin plate 10 is, for example, a plate in a substantially square shape formed of resin, and fixed to a surface of the pin block 20 at a side of the tester, with eight screws 101 in the illustrated example. Positioning of the pin block 20 before screw fastening is performed by two positioning pins 12. The pin plate 10 has a plurality of (numerous) through holes 11 for allowing the respective contact probes 50 to pass through. The pin block 20 is formed of metal, and functions as a shield for shutting off noises. The pin block 20 is in a shape of a plate having a larger thickness than the pin plate 10, and formed in a substantially square shape having a substantially same size as the pin plate 10. The pin block 20 is formed to be substantially larger than the retainer 30 which will be described below, and provided with a retainer mounting part 20a which is recessed by one step for the purpose of containing the retainer, at the side of the object to be inspected. The retainer mounting part 20a of the pin block 20 has screw holes for fastening the below described retainer 30 with screws in an outer circumferential region thereof, and a plurality of (numerous) through holes 21 for allowing the contact probes 50 to pass through, in an inner region except the outer circumferential region.

The retainer 30 is, for example, a plate in a substantially square shape formed of resin, and has screw holes for passing screws 102, in an outer circumferential region thereof. The retainer 30 is fixed to the retainer mounting part 20a of the pin block 20 at the side of the object to be inspected with the sixteen screws 102 in the illustrated example. The retainer 30 has a plurality of (numerous) through holes 31 for allowing the contact probes 50 to pass through, in an inner region except the outer circumferential region. The through holes 11 in the pin plate 10, the through holes 21 in the pin block 20, and the through holes 31 in the retainer 30 are continued to each other in a stacked manner, thereby to form a single through hole for supporting the respective contact probes 50 (FIG. 3). As described below, each of the contact probes 50 is so constructed that a first plunger 51 and a second plunger 52 are urged so as to be separated from each other, and so as to protrude from both ends of an electrically conductive tube 53. The through hole 31 in the retainer 30 has a small diameter part for passing a tip end of the first plunger 51, and a large diameter part for holding the conductive tube 53 so that a drop of the contact probe 50 may be prevented. The through hole 11 in the pin plate 10 has a small diameter part for passing a tip end of the second plunger 52, and a large diameter part for holding the conductive tube 53 so that a drop of the contact probe 50 may be prevented.

As shown in FIG. 4, when the socket 1 is set on the inspecting board 5 at the side of the tester, the second plungers 52 of the respective contact probes 50 are retracted against urging forces of the springs 54, and the springs 54 are compressed. On this occasion, the conductive tubes 53 at aside close to the first plungers 51 urge the through holes 31 of the retainer 30, with restoring forces (preloads) of the springs 54 which have been compressed, and act to separate (warp) the retainer 30 from the pin block 20. Although the outer circumferential region of the retainer 30 which is fixed to the pin block 20 with the screws 102 will not be warped, a warp occurs in a region remote from the outer circumferential region, especially near the center part. As the results, positions of the tip ends of the first plungers 51 of the respective contact probes 50 vary, and hence, a problem in measurement may occur.

In this embodiment, as a countermeasure against the warp in the center part of the retainer 30, the retainer 30 is engaged with the pin block 20 in a concavo-convex manner. Specifically, an annular concave part 22 which is formed on the surface of pin block 20 at the side of the retainer 30 as shown in FIG. 1 and an annular convex part 32 which is formed on the surface of the retainer 30 at the side of the pin block 20 as shown in FIGS. 5A and 5B are engaged with each other.

As the results, the retainer 30 is fixed to the pin block 20 by a holding force in the engaged part.

The convex part 32 of the retainer 30 is formed by an annular ridge with a predetermined width that is made into a rectangular shape, and so provided as to surround the center part of the region of the retainer 30 where the contact probes 50 are arranged (the region where the through holes 31 are arranged). The concave part 22 of the pin block 20 is formed by an annular groove with a predetermined width that is made into a rectangular shape so that the convex part 32 of the retainer 30 may be engaged into the concave part 22, and so provided as to surround a center part of the region of the pin block 20 where the contact probes 50 are arranged (the region where the through holes 21 are arranged). Moreover, as shown in FIGS. 5A, 5B, and FIGS. 7A, 7B, side edges of the concave part 22 and the convex part 32 extend between the adjacent through holes 21, 31 so as not to interfere with the through holes. As shown in FIG. 6, the convex part 32 has a stepped part 32a on a side face thereof, and has a larger width in a base part than in a distal end part thereof. A width of the stepped part 32a of the convex part 32 is formed slightly larger than a width of the concave part 22 in a corresponding position, while the width of the convex part 32 in the distal end part side against the stepped part 32a is formed slightly smaller than the width of the concave part 22 in a corresponding position. Accordingly, when the convex part 32 is engaged with the concave part 22, the stepped part 32a of the convex part 32 is collapsed by the concave part 22 (the convex part 32 is press-fitted into the concave part 22) in a direction (a vertical direction in FIG. 6) different from an engaging direction (a lateral direction in FIG. 6). In this manner, the retainer 30 is fixed to the pin block 20. Prior to press-fitting, the retainer 30 is made parallel to the pin block 20, in a state where a border face of the stepped part 32a is placed on the concave part 22 (in a state where a part of the convex part 32 forward than the stepped part 32a is inserted into the concave part 22). From this paralleled state, the retainer 30 can be press-fitted into the pin block 20.

As described herein above, it is possible to depress a warp of the retainer 30 due to a preload, by engaging the convex part 32 of the retainer 30 with the concave part 22 of the pin block 20. A depth of the concave part 22 is larger than a half of the thickness of the pin block 20, and a protruding length of the convex part 32 corresponds to this depth. As the results, it is possible to reliably hold the convex part 32 of the retainer 30 by the concave part 22 of the pin block 20. Moreover, it is desirable to provide at least two or more through holes in a direction of the widths of the concave part 22 and the convex part 32, from a viewpoint of securing rigidity of the concave part 22 and the convex part 32.

The guide member 40 is, for example, a frame-like body formed of resin having an opening 41 in a center part thereof, and fixed to the surface of the pin block 20 at a side of the object to be inspected, with six screws 103 in the illustrated example. Two positioning pins 42 for positioning a handler (not shown) which holds and transfers the object to be inspected are attached to the guide member 40 with screws 104. Six screws 105 pass through the guide member 40, the pin block 20 and the pin plate 10, to be screwed to the pin plate 10 at the side of the tester (not shown). In this manner, the socket 1 is fixed to the inspecting board 5 at the side of the tester.

As shown in FIG. 3, each of the contact probes 50 has the first plunger 51 to be connected with the object to be inspected, the second plunger 52 to be connected with the inspecting board 5 (FIG. 4) at the side of the tester, the electrically conductive tube 53, and the spring 54. The base end portion of the first plunger 51 is contained in the conductive tube 53, while a distal end portion thereof is projected from the surface of the retainer 30 at the side of the object to be inspected. The base end portion of the second plunger 52 is contained in the conductive tube 53, while a distal end portion thereof is projected from the surface of the pin plate 10 at the side of the tester. The spring 54 is contained in the conductive tube 53, and urges the first plunger 51 and the second plunger 52 so as to be separated from each other.

Out of the five contact probes 50 which are shown in FIG. 3, the first contact probe 50 from the left is for high frequency signals (for example, radio frequency signals of GHz unit), the second and third contact probes 50 from the left are for low frequency signals or for power supply, and the fourth and fifth contact probes 50 from the left are for grounding. The through hole 21 in the pin block 20 through which the contact probe 50 for the high frequency signals passes has a larger diameter than the other through holes 21. The through holes 21 in the pin block 20 through which the contact probes 50 for grounding pass have substantially the same diameter as the conductive tubes 53, and are respectively kept in contact with side faces of the conductive tubes 53. The through holes 21 in the pin block 20 through which the contact probes 50 for the low frequency signals and for power supply pass have a larger diameter than the conductive tubes 53 so as not to get in touch with the side faces of the conductive tubes 53 (so as not to get short), and have smaller diameter than the through hole 21 for the contact probe 50 for the high frequency.

In this embodiment, the concave part 22 of the pin block 20 is provided in the region where the through hole 21 which holds the contact probe 50 for the high frequency signals is not formed. Accordingly, in the region where the contact probe for the high frequency signals is arranged, the whole thickness of the pin block 20 can be used as an element for composing a coaxial structure around the contact probe 50 as an axis. As the results, it is possible to prevent deterioration of shielding effect of the pin block 20 with respect to the contact probe 50 for the high frequency signals. Moreover, the concave part 22 is provided in the region which is not adjacent to the through hole 21 for holding the contact probe 50 for the high frequency signals, because a distance between the through hole 21 for holding the contact probe 50 for the high frequency signals and the adjacent through hole 21 is too short, and it is difficult to form the concave part 22.

According to this embodiment, the following advantages can be obtained.

(1) The retainer 30 has the convex part 32 in the region where the contact probes 50 are arranged (the region where the through holes 31 are arranged), and the convex part 32 is engaged with the concave part 22 of the pin block 20. For this reason, it is possible to depress a warp of the retainer 30 due to a preload, by the holding force in the engaged part.

(2) The concavo-convex engagement between the convex part 32 of the retainer 30 and the concave part 22 of the pin block 20 is fixation by press-fitting, and therefore, it is possible to obtain the high holding force in the engaged part.

(3) Both the convex part 32 of the retainer 30 and the concave part 22 of the pin block 20 are formed in an annular shape. Therefore, it is possible to secure a large surface area which generates the holding force (a surface area of the stepped part 32a of the convex part 32), and the high holding force can be obtained.

(4) The convex part 32 of the retainer 30 is so formed as to surround the center part of the region where the contact probes 50 are arranged. Therefore, the holding force by the engagement with the concave part 22 of the pin block 20 can be obtained at a position where a warp is likely to occur, and hence, it is possible to effectively depress the warp of the retainer 30.

(5) In case where the retainer 30 is fixed with screws or the like near the center part of the surface thereof, for the purpose of preventing a warp of the retainer 30 due to a preload, the contact probes 50 cannot be arranged in the screwed region, and arrangement of the contact probes 50 is restricted. However, in this embodiment, the retainer 30 is engaged with the pin block 20 by the concavo-convex engagement, as described above, and therefore, it is possible to depress a warp of the retainer 30 due to a preload, without giving restriction to the arrangement of the contact probes 50.

(6) The concave part 22 of the pin block 20 is provided in the region where the through hole 21 for holding the contact probe 50 for the high frequency signals is not formed. Therefore, even in case of a structure provided with the concave part 22, it is possible to maintain the high shielding effect of the pin block 20 with respect to the contact probe 50 for the high frequency signals.

Although the invention has been heretofore described referring to the embodiment as an example, it is to be understood by those skilled in the art that various modifications can be made in the respective constituent elements and respective treating processes in the embodiment, within a scope described in the claims. The modifications will be described below.

Figure 8:
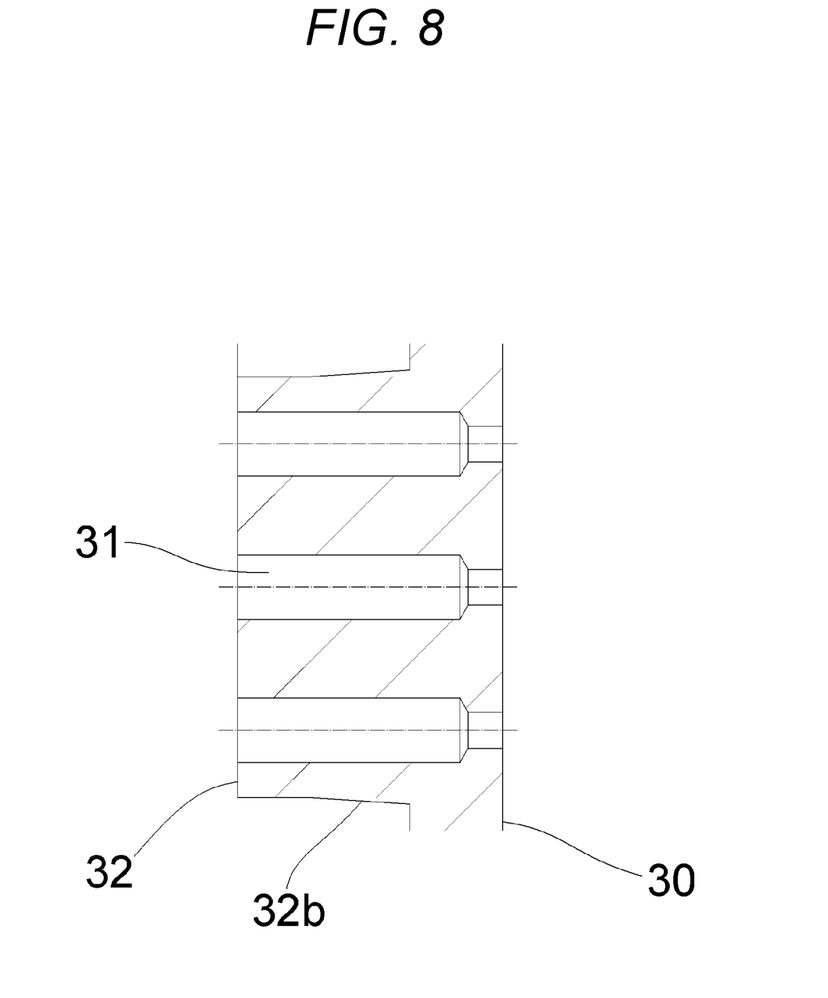
FIG. 8 is a sectional view of the retainer 30 as shown in FIG. 6, in case where a stepped part 32a of a convex part 32 is modified to a taper part 32b.

FIG. 8 is a sectional view of the retainer 30 as shown in FIG. 6, in case where the stepped part 32a of the convex part 32 is modified to a taper part 32b. In this manner, in the retainer 30, it is possible to modify the stepped part 32a of the convex part 32 to the taper part 32b. In this case too, the taper part 32b is collapsed by the concave part 22 of the pin block 20, and hence, it is possible to obtain the holding force for depressing a warp of the retainer 30 due to a preload.

Although the structure in which the concave part 22 is provided in the pin block 20 and the convex part 32 is provided in the retainer 30 has been described in the above embodiment, the concavo-convex relation may be contrary to the structure in the embodiment. Specifically, it is also possible to provide the convex part in the pin block 20, and the concave part in the retainer 30. Moreover, shapes of the concave part 22 and the convex part 32 are not limited to the annular shape. For example, an angled pillar and an angled hole to be engaged with the angled pillar may be adopted. Further, the shape is not limited to the rectangular shape, but may be a round shape. The shape need not be a simple shape but may be such a shape that an edge of the rectangular shape is, for example, formed in a zigzag manner. Anyway, the shape may be optionally determined according to the required holding force. Moreover, the number of the concave part 22 and the convex part 32 is not limited to one, but may be plural.

In the above embodiment, such an arrangement that the contact probes 50 are supported by a three-layer structure including the insulating pin plate 10, the electrically conductive pin block 20, and the insulating retainer 30 has been described. However, it is also possible to employ such a structure that the contact probes 50 are supported by a two-layer structure including an insulating pin block and an insulating retainer. The present invention can be extensively applied to all the sockets in which warps are likely to occur in a retainer by preloads.

According to an aspect of the invention, it is possible to provide a socket in which a warp of a retainer due to a preload can be depressed.

What is claimed is:

1. A socket comprising:
a plurality of contact probes;
a pin block having first through-holes through which the contact probes respectively penetrate and one of a concave part and a convex part; and
a retainer having second through-holes through which the contact probes respectively penetrate and the other of the concave part and the convex part,
wherein the pin block and the retainer are stacked to each other,
wherein the first through-holes and the second through-holes communicate with each other and form a plurality of pairs of first and second through-holes, respectively, and each of the contact probes is supported by one corresponding pair of the plurality of pairs of first and second through-holes, and
wherein the retainer and the pin block are engaged with each other by concavo-convex engagement by the concave and the convex part.

2. The socket according to claim 1, wherein
the concavo-convex engagement of the retainer with the pin block is fixation by press-fitting.

3. The socket according to claim 2, wherein
the retainer has a stepped part or a taper part in the concavo-convex engagement where the retainer is engaged with the pin block, and
the stepped part or the taper part is collapsed in a direction different from an engaging direction in which the retainer is engaged with the pin block.

4. The socket according to claim 1, wherein
the retainer is formed of resin, and the pin block is formed of metal.

5. The socket according to claim 1, wherein
the concave part and the convex part are provided in a region where a through hole for supporting a contact probe for a high frequency signal is not formed.

6. The socket according to claim 1, wherein
the concavo-convex engagement includes an annular concave part which is provided in one of the retainer and the pin block, and an annular convex part which is provided in the other of the retainer and the pin block.

7. The socket according to claim 1, wherein
each of the plurality of contact probes has two plungers which are urged so as to be separated from each other by a spring.

8. The socket according to claim 7, wherein
one of the plungers of each of the plurality of contact probes at a side of an object to be inspected is protruded from a surface of the retainer.

9. The socket according to claim 1, wherein
at least two pairs of the plurality of pairs of first and second through-holes are provided in an area of the concavo-convex engagement.

10. The socket according to claim 1, wherein
at least one of the plurality of contact probes passes through an area of the concavo-convex engagement.

* * * * *